(12) United States Patent
Bohra et al.

(10) Patent No.: US 11,222,854 B2
(45) Date of Patent: Jan. 11, 2022

(54) MULTITIER ARRANGEMENTS OF INTEGRATED DEVICES, AND METHODS OF PROTECTING MEMORY CELLS DURING POLISHING

(71) Applicant: Micron Technology, Inc., Boise, ID (US)

(72) Inventors: Mihir Bohra, Boise, ID (US); Tarun Mudgal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 16/412,622

(22) Filed: May 15, 2019

(65) Prior Publication Data

US 2020/0365524 A1 Nov. 19, 2020

(51) Int. Cl.
*H01L 23/00* (2006.01)
*H01L 27/24* (2006.01)
(Continued)

(52) U.S. Cl.
CPC ...... *H01L 23/562* (2013.01); *H01L 21/30625* (2013.01); *H01L 21/743* (2013.01);
(Continued)

(58) Field of Classification Search
CPC .............. H01L 21/76801–76837; H01L 23/5329–53295; H01L 21/823878; H01L 21/76885; H01L 21/7684; H01L 21/76877–76883; H01L 23/481; H01L 21/76898; H01L 21/30625; H01L 21/743; H01L 23/535; H01L 23/562;
(Continued)

(56) References Cited

U.S. PATENT DOCUMENTS 7,176,077 B2 * 2/2007 Abedifard ............ H01L 27/115
257/315
7,947,529 B2 5/2011 Eng et al.
(Continued)

FOREIGN PATENT DOCUMENTS

KR 10-2015-0081161 7/2015
TW 109114899 2/2009
(Continued)

*Primary Examiner* — Mark W Tornow
*Assistant Examiner* — Priya M Rampersaud
(74) *Attorney, Agent, or Firm* — Wells St. John P.S.

(57) ABSTRACT

Some embodiments include a method of forming an arrangement. A first tier is formed to include CMOS circuitry. A second tier is formed to include an assembly which has first and second sets of memory cells on opposing sides of a coupling region. A support material is adjacent the first and second sets of the memory cells, and an intervening material is adjacent the support material. The support material has a different composition than the intervening material. A conductive interconnect extends through the intervening material. An upper surface of the assembly is polished to reduce an overall height of the assembly. The support material provides support during the polishing to protect the memory cells from being eroded during the polishing. The conductive interconnect of the second tier is coupled with the CMOS circuitry of the first tier. Some embodiments include multitier arrangements.

21 Claims, 16 Drawing Sheets

(51) Int. Cl.
*H01L 45/00* (2006.01)
*H01L 21/306* (2006.01)
*H01L 23/535* (2006.01)
*H01L 21/74* (2006.01)

(52) U.S. Cl.
CPC ........ *H01L 23/535* (2013.01); *H01L 27/2427* (2013.01); *H01L 45/06* (2013.01); *H01L 45/1233* (2013.01); *H01L 45/144* (2013.01); *H01L 45/146* (2013.01); *H01L 45/16* (2013.01)

(58) Field of Classification Search
CPC . H01L 27/2427; H01L 27/2463; H01L 45/06; H01L 45/1233; H01L 45/144; H01L 45/146; H01L 45/16
See application file for complete search history.

(56) References Cited

U.S. PATENT DOCUMENTS

| | | | |
|---|---|---|---|
| 8,525,320 | B2 | 9/2013 | Eng et al. |
| 8,847,186 | B2 | 9/2014 | Redaelli et al. |
| 2001/0019893 | A1* | 9/2001 | Prall ................ H01L 21/76897 438/689 |
| 2002/0109173 | A1* | 8/2002 | Forbes .............. H01L 29/66666 257/300 |
| 2003/0012117 | A1* | 1/2003 | Ogawa ............. H01L 27/10894 369/200 |
| 2004/0032013 | A1 | 2/2004 | Cobbley et al. |
| 2004/0228172 | A1* | 11/2004 | Rinerson ........... G11C 13/0007 365/158 |
| 2005/0037572 | A1* | 2/2005 | Lee .................. H01L 27/11521 438/257 |
| 2006/0079052 | A1* | 4/2006 | Kanamori ........ H01L 27/11521 438/257 |
| 2009/0045489 | A1 | 2/2009 | Eng et al. |
| 2011/0045634 | A1 | 2/2011 | Pagaila |
| 2011/0140069 | A1* | 6/2011 | Inoue ................ H01L 27/2472 257/5 |
| 2011/0215453 | A1 | 9/2011 | Eng et al. |
| 2013/0140515 | A1* | 6/2013 | Kawashima ........ H01L 45/085 257/4 |
| 2014/0063913 | A1* | 3/2014 | Kawashima ....... G11C 13/0069 365/148 |
| 2015/0287733 | A1* | 10/2015 | Matsudaira ....... H01L 27/11519 257/315 |
| 2018/0175109 | A1 | 6/2018 | Choi et al. |
| 2018/0358549 | A1 | 12/2018 | Bernhardt et al. |
| 2019/0035755 | A1 | 1/2019 | Pachamuthu et al. |
| 2019/0043807 | A1* | 2/2019 | Redaelli ............. H01L 23/5329 |
| 2020/0235163 | A1 | 7/2020 | Karpov et al. |
| 2020/0303463 | A1* | 9/2020 | Redaelli ............. H01L 27/2481 |

FOREIGN PATENT DOCUMENTS

| | | |
|---|---|---|
| WO | WO 2009/025974 | 2/2009 |
| WO | WO 2019/055008 | 3/2019 |
| WO | WO PCT/US2020/028122 | 7/2020 |

* cited by examiner

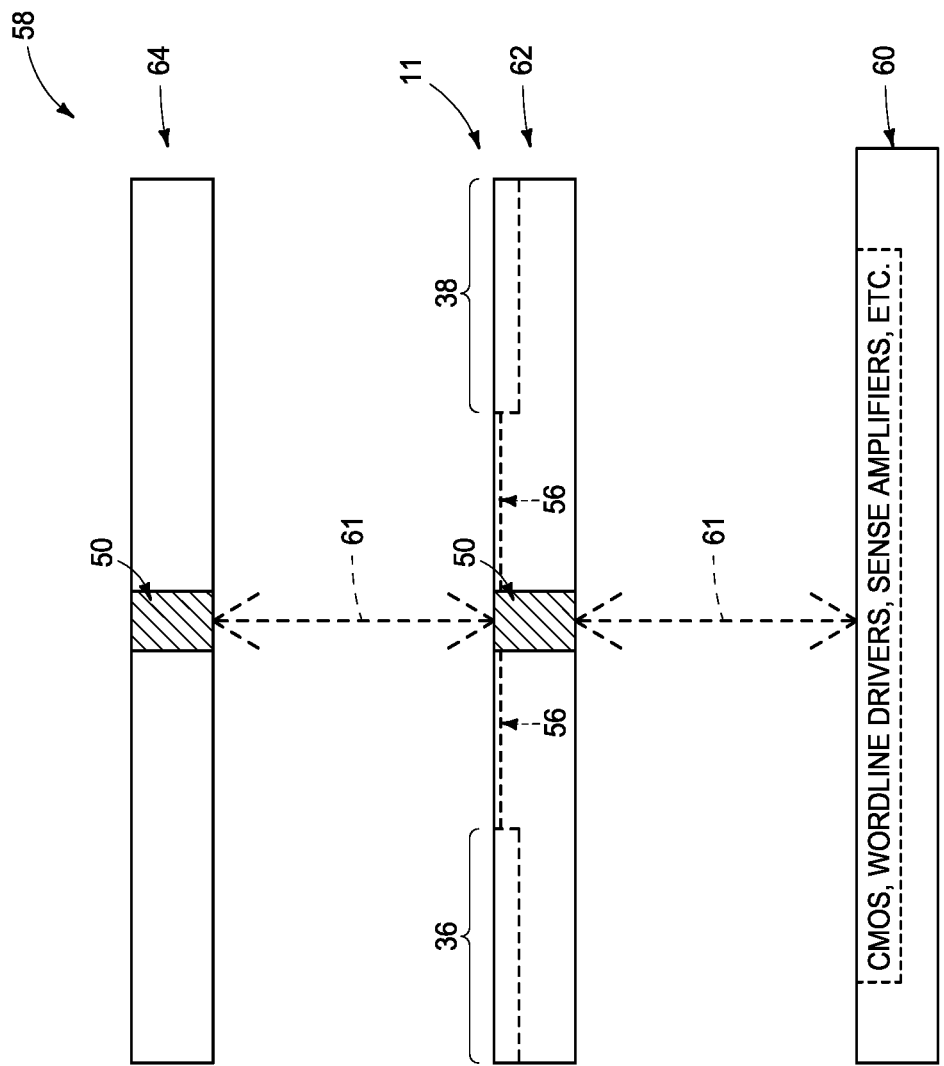

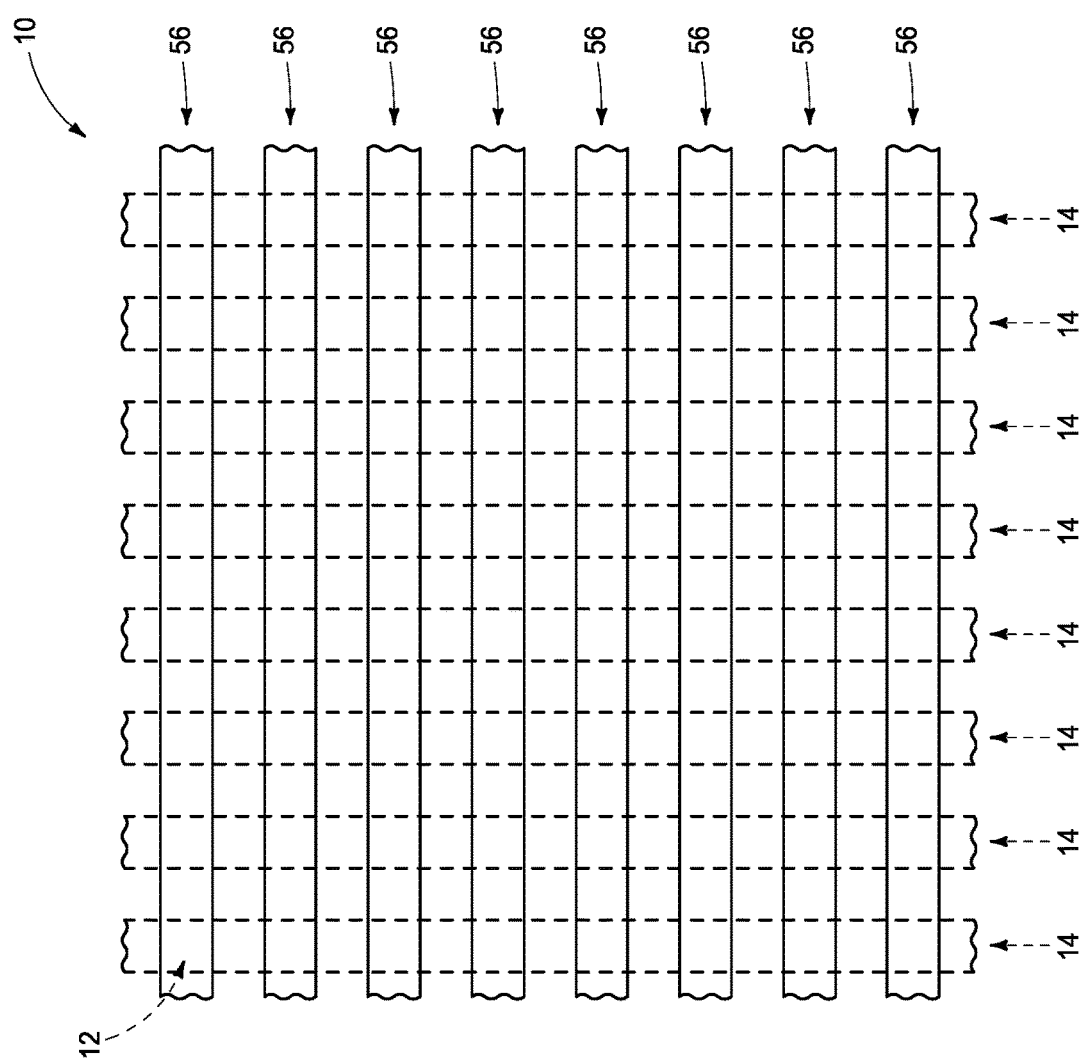

MULTITIER ARRANGEMENTS OF INTEGRATED DEVICES, AND METHODS OF PROTECTING MEMORY CELLS DURING POLISHING

TECHNICAL FIELD

Multitier arrangements of integrated devices, and methods of protecting memory cells during polishing.

BACKGROUND

Efforts are being directed toward forming multitier arrangements of integrated devices. For instance, a tier comprising memory may be formed over a tier comprising drivers, sense amplifiers, etc. It is desired to develop structures suitable for electrically coupling the components of the upper tier with those of the lower tier, and to develop methods of forming such structures.

BRIEF DESCRIPTION OF THE DRAWINGS

FIG. 4 is a diagrammatic cross-sectional side view of an example multitier configuration.

FIG. 7B is a diagrammatic top view of a region of the assembly of FIG. 7 illustrating the wordlines and bitlines in isolation from other components.

DETAILED DESCRIPTION OF THE ILLUSTRATED EMBODIMENTS

Some embodiments include multitier architectures in which a memory tier is over a tier comprising CMOS circuitry, and in which components of the memory tier are electrically coupled with the CMOS circuitry through conductive interconnects. The conductive interconnects within the memory tier may extend through an intervening insulative material, and may be adjacent an insulative support material. The intervening insulative material may comprise silicon dioxide, and the insulative support material may comprise one or more high-k compositions. Some embodiments include methods of protecting memory cells during one or more polishing process by providing support material adjacent the memory cells. Example embodiments are described with reference to FIG. 1-9.

Figure 1:
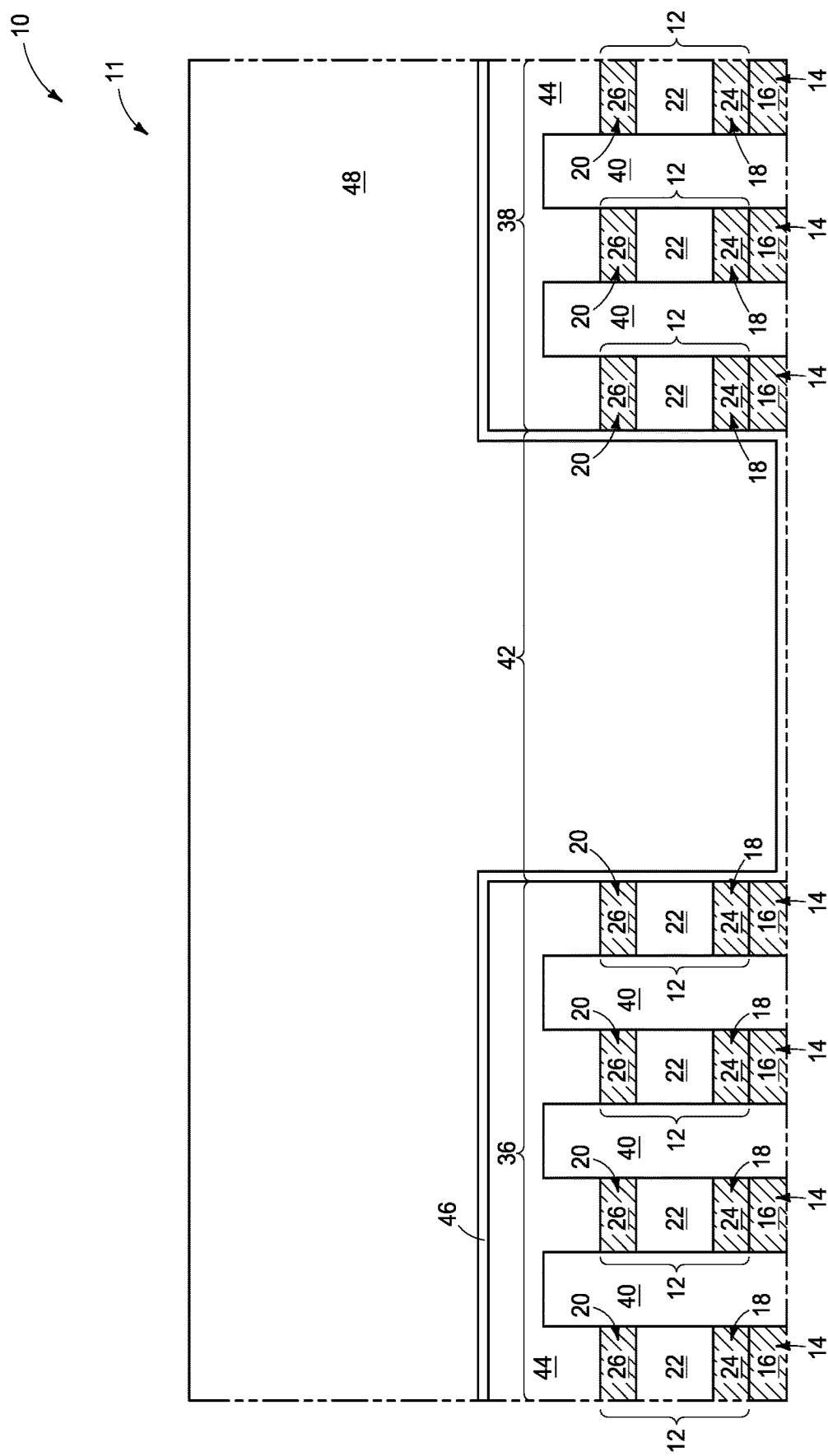
FIG. 1 is a diagrammatic cross-sectional side view of an assembly at an example process stage of an example embodiment.

Referring to FIG. 1, an assembly 10 is illustrated at an example process stage of an example method for forming an interconnect through an array of memory cells. The assembly includes a memory array 11 which comprises memory cells 12. The memory cells 12 are supported by wordlines (access lines) 14. The illustrated memory cells 12 may be representative of a large number of substantially identical memory cells within the memory array 11; and in some embodiments the memory array 11 may comprise hundreds, thousands, millions, hundreds of millions, etc., of the memory cells. The term "substantially identical" means identical to within reasonable tolerances of fabrication and measurement. The illustrated wordlines 14 may be representative of a large number of substantially identical wordlines within the memory array.

The wordlines 14 comprise conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 16 may comprise one or more metals and/or metal-containing compositions; and may, for example, comprise tungsten over tantalum nitride.

Each of the memory cells 12 comprises a bottom electrode 18, a top electrode 20, and a programmable material 22 between the top and bottom electrodes. The electrodes 18 and 20 comprise conductive electrode materials 24 and 26, respectively. The electrode materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The electrode materials 24 and 26 may be the same composition as one another, or may be different compositions relative to one another. In some example embodiments, the electrode materials 24 and 26 may comprise, consist essentially of, or consist of one or more of TiSiN (titanium silicon nitride), TiAlN (titanium aluminum nitride), TiN (titanium nitride), WN (tungsten nitride), Ti (titanium), C (carbon) and W (tungsten); where the formulas indicate the components within the listed substances, rather than designating specific stoichiometries of such components.

The bottom electrodes 18 are electrically coupled with the wordlines, and in the shown embodiment are directly against the wordlines.

The programmable material 22 may comprise any suitable composition(s). In some embodiments, the programmable material 22 may be an ovonic memory material, and specifically may be a chalcogenide. For instance, the programmable material 22 may comprise one or more of germanium (Ge), antimony (Sb), tellurium (Te) and indium (In). In specific embodiments, the programmable material 22 may, for example, comprise, consist essentially of, or consist of GeSbTe or InGeTe, where the formulas indicate the components within the listed substances, rather than designating specific stoichiometries of such components. In some embodiments, the memory cells may comprise programmable material configured to be utilized in self-selecting devices; for example, a chalcogenide material may act both as a storage element and as a select device. The chalcogenide may be utilized alone in the self-selecting device, or may be utilized in combination with another composition. Example self-selecting PCM devices (with PCM devices being devices comprising phase change material) are described in U.S. Pat. No. 8,847,186 (Redaelli et al.) and U.S. Pat. No. 10,134,470 (Tortorelli et al.), listing Micron Technology, Inc. as the assignee.

Figure 1A:
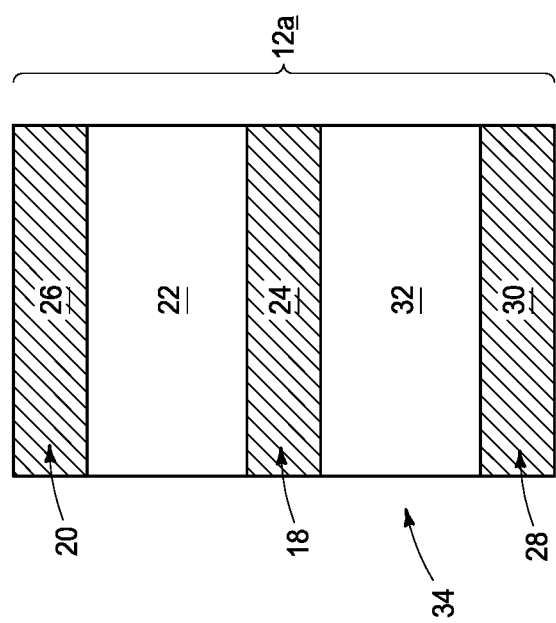
FIG. 1A is a diagrammatic cross-sectional view of an example memory cell which may be utilized instead of the example memory cells shown in FIG. 1.

The memory cells 12 are example memory cells which may be utilized in a memory array. In other embodiments, the memory cells may have other configurations. For instance, FIG. 1A shows a memory cell 12a having another example configuration. The memory cell 12a includes the electrodes 18 and 20, and further includes a third electrode 28. In some embodiments, the electrodes 28, 18 and 20 may be referred to as a bottom electrode, a middle electrode, and a top electrode, respectively. The electrode 28 comprises electrode material 30. Such electrode material may comprise any of the compositions described above relative to the electrode materials 24 and 26; and may be the same composition as one or both of the electrode materials 24 and 26, or may be compositionally different than at least one of the electrode materials 24 and 26.

The ovonic material 22 may be referred to as a first ovonic material between the upper electrode 20 and the middle electrode 18. A second ovonic material 32 is between the lower electrode 28 and the middle electrode 18. The second ovonic material 32 may be incorporated into an ovonic threshold switch (OTS) of a select device 34. The memory cell 12a may thus comprise the programmable material 22 in combination with the select device 34, rather than being in a self-selecting configuration.

The ovonic material 32 may comprise any suitable composition(s), and in some embodiments may comprise one or more of the compositions described above as being suitable for the programmable material 22.

Referring again to FIG. 1, the wordlines 14 may be considered to extend in and out of the page relative to the cross-sectional view. Insulative material 40 is between the wordlines, and spaces the wordlines from one another. The insulative material 40 also isolates neighboring memory cells 12 from one another. The insulative material 40 may comprise any suitable composition(s); and in some embodiments may comprise, consist essentially of, or consist of silicon dioxide.

The cross-sectional view of FIG. 1 shows the memory cells 12 arranged to form a first set 36 and a second set 38 (in some embodiments, the first and second sets 36 and 38 may be referred to as first and second regions of the memory array 11). A coupling region 42 is between the first and second sets 36 and 38 of the memory cells. Eventually, a conductive interconnect will be formed within the coupling region.

A capping material 44 is over the first and second sets (36, 38) of the memory cells 12. The capping material 44 may comprise any suitable composition(s); and in some embodiments may comprise, consist essentially of, or consist of silicon nitride.

A liner 46 extends over the capping material 44 and across the coupling region 42. The liner 46 may comprise any suitable composition(s); and in some embodiments may comprise, consist essentially of, consist of silicon dioxide.

An insulative material 48 is provided over the liner 46 and across the coupling region 42. The insulative material 48 may comprise any suitable composition(s); and in some embodiments may comprise, consist essentially of, consist of silicon dioxide. The insulative material 48 may be referred to as an intervening insulative material in some of the applications described herein.

The materials 46 and 48 may comprise the same composition as one another (e.g., may both comprise silicon dioxide), but are shown as separate materials to emphasize that they may be formed by separate methods.

Figure 2:
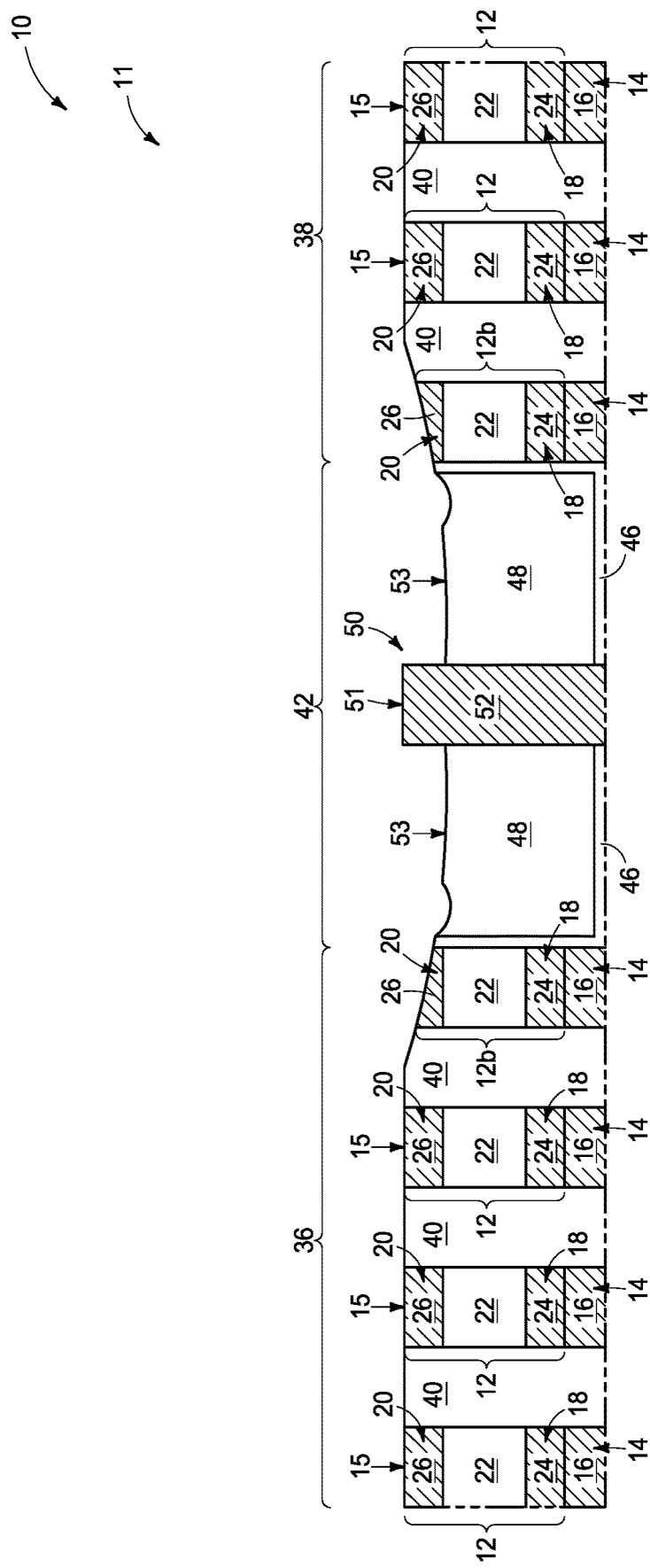
FIG. 2 is a diagrammatic cross-sectional side view of the assembly of FIG. 1 at an example process stage following that of FIG. 1.

Referring to FIG. 2, the assembly 10 is shown after formation of a conductive interconnect 50 within the coupling region 42; and after one or more polishing processes have been utilized to expose upper surfaces 15 of the memory cells 12, and an upper surface 51 of the conductive interconnect 50.

The conductive interconnect comprises conductive material 52. The conductive material 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive interconnect 50 may extend entirely through a tier (i.e., deck, level, etc.) comprising the memory array 11. The conductive interconnect 50 may comprise multiple compositions, and may comprise different compositions at various locations throughout the tier. The illustrated portion of the conductive interconnect 50 may comprise, consist essentially of, or consist of tungsten in some example embodiments.

The conductive interconnect 50 may be formed with any suitable processing. For instance, in some example embodiments a via may be formed to extend through the materials within the coupling region 42, and then suitable conductive material(s) may be provided within the via to form the conductive interconnect 50.

The polishing utilized to expose the surfaces 15 and 51 may include multiple polishing steps to penetrate through the various materials shown in FIG. 1. A problem which may occur during such polishing is dishing, which is diagrammatically illustrated in FIG. 2 with a nonplanar profile 53 in the soft material 48 adjacent the conductive interconnect 50. In the illustrated application of FIG. 2, a couple of the memory cells 12 near the coupling region 42 are labeled as 12b so that they may be distinguished from others of the memory cells. The nonplanar profile 53 undesirably extends into the memory cells 12b, and erodes the conductive material 26 of the top electrodes 20 of such memory cells.

The erosion may also extend deeper than illustrated in FIG. 2 to penetrate into the programmable material 22 of the memory cells 12b.

The erosion of one or more materials of the memory cells 12b may alter performance characteristics of such memory cells as compared to other memory cells which have not had erosion. Such may render one or more of the memory cells 12b unsuitable for its intended application. Further, although only the memory cells nearest the coupling region 50 are shown to be eroded, in practice the dishing may extend a considerable distance into the memory array so that a significant number of the memory cells may be rendered inoperable.

Figure 2A:
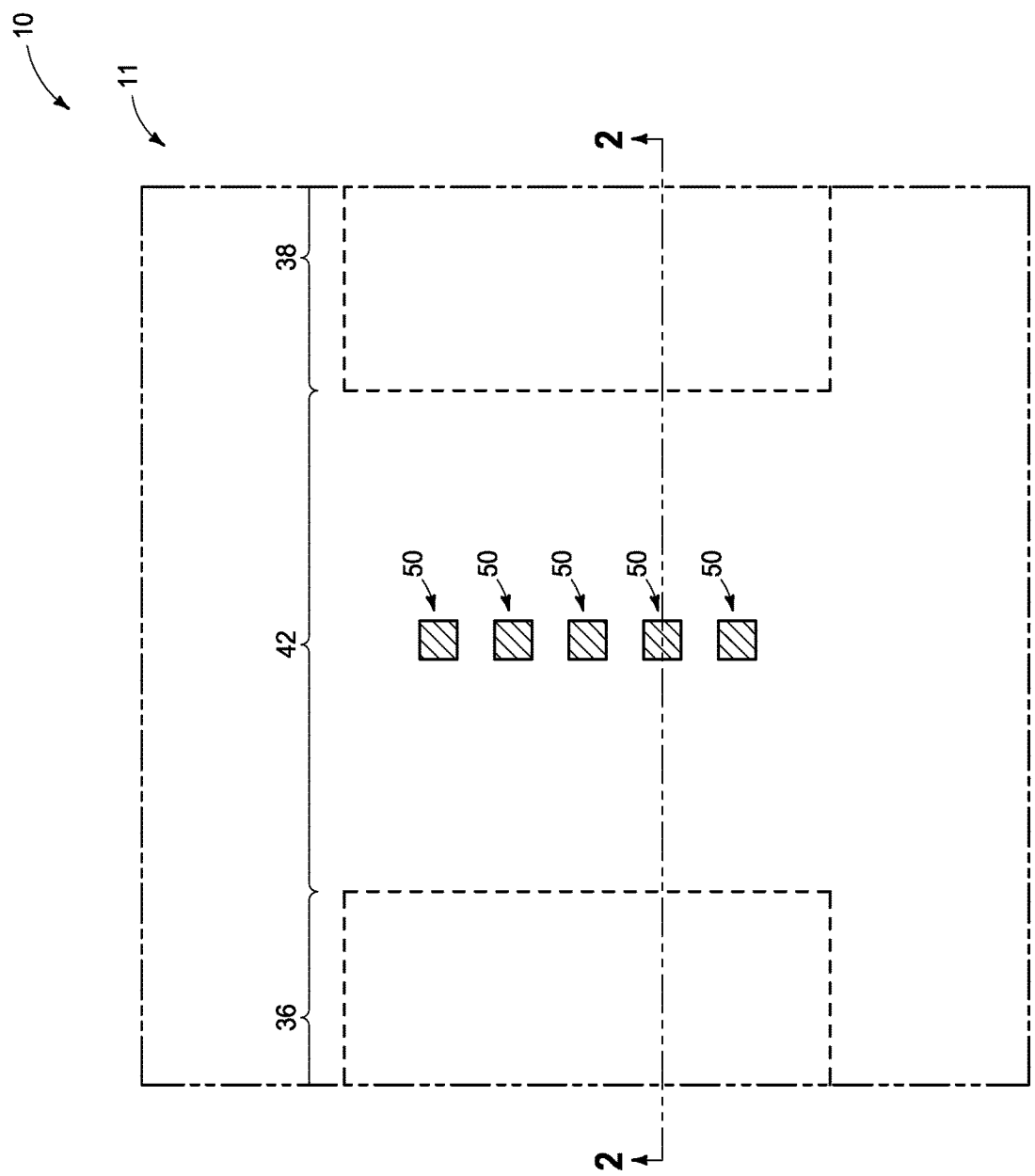
FIG. 2A is a diagrammatic top view of a region of the assembly of FIG. 2. The cross-section of FIG. 2 is along the line 2-2 of FIG. 2A.

FIG. 2A shows a top view of the assembly 10 at the processing stage of FIG. 2. The view of FIG. 2A is not to scale relative to the view of FIG. 2, and utilizes a different diagrammatic representation of the assembly 10 than is utilized in FIG. 2. Regardless, the cross-section of FIG. 2 may be understood to be generally along the line 2-2 of FIG. 2A.

FIG. 2A shows the coupling region 42 between the first and second sets 36 and 38 of memory cells (the individual memory cells are not shown in FIG. 2A). The coupling region comprises a plurality of the conductive interconnects 50. The conductive interconnects are arranged along a line, with such line extending along a direction which would be in and out of the page relative to the plane of the cross-section of FIG. 2. The conductive interconnects may be square-shaped in top-down view (as shown), or may have any other suitable shapes, including, for example, circular shapes, rectangular shapes, elliptical shapes, etc.

It is to be understood that even though the cross-section of FIG. 2 only comprises one of the conductive interconnects 50 within the illustrated portion of the coupling region 42, in other embodiments there may be multiple conductive interconnects formed along the cross-section of FIG. 2. Accordingly, even though FIG. 2A shows a single row of the interconnects 50 within the coupling region 42, in other embodiments there may be multiple rows of such interconnects within the coupling region to form a matrix of the interconnects across the coupling region. Also, it is to be understood that the illustrated interconnects 50 of FIGS. 2 and 2A may be representative of a large number of substantially identical interconnects formed within the coupling region 42. For instance, in some embodiments there may be hundreds, thousands, millions, hundreds of thousands, etc., of conductive interconnects 50 formed within the coupling region 42.

Figure 3:
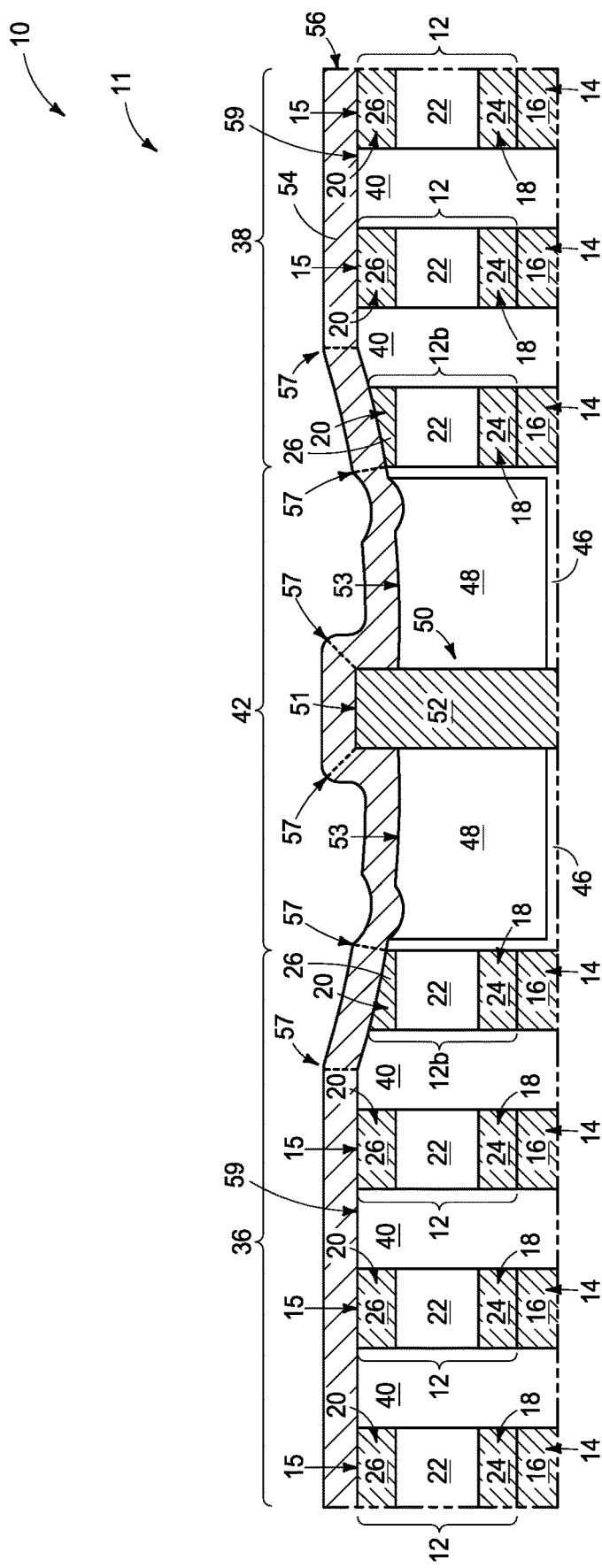
FIG. 3 is a diagrammatic cross-sectional side view of the assembly of FIG. 1 at an example process stage following that of FIG. 2.

Referring to FIG. 3, conductive material 54 is formed to extend across the first and second sets (36, 38) of the memory cells 12, and across the coupling region 42; and is patterned into a digit line (sense line, access line) 56. The conductive material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

A problem with the configuration of FIG. 3 is that the nonplanar profile 53 of the illustrated deep dishing provides an uneven surface for supporting the bitline 56. Accordingly, the bitline has relatively severe bends at or near the illustrated locations 57. The bitline may partially break or may thin at or near the locations 57, which can cause undesired high resistance within the bitline at such locations. Further, the bitline may fail to follow the underlying nonplanar topography. Accordingly, there may be spaces (gaps) remaining under portions of the bitline which can lead to later problems during fabrication of subsequent structures over the bitline and/or during operation of the bitline.

Figure 3A:
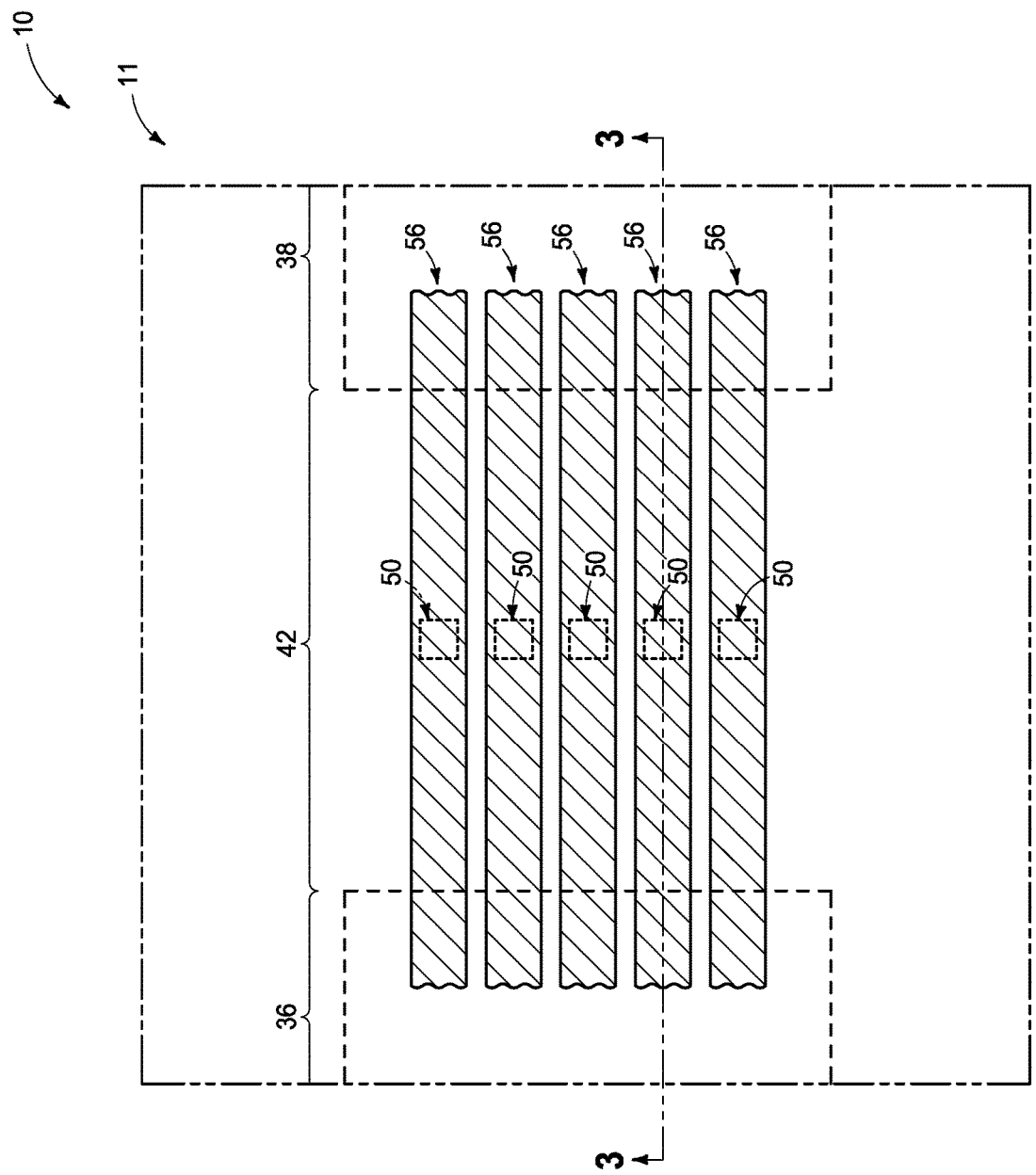
FIG. 3A is a diagrammatic top view of a region of the assembly of FIG. 3. The cross-section of FIG. 3 is along the line 3-3 of FIG. 3A.

FIG. 3A shows a top view of the assembly 10 at the processing stage of FIG. 3 utilizing a diagrammatic illustration analogous to that of FIG. 2A. The bitline 56 of FIG. 3 is one of a plurality of bitlines which are formed across the memory array 11. Each of the bitlines extends across one of the illustrated conductive interconnects 50. The conductive interconnects 50 are shown in dashed-line view to indicate that they are under the bitlines 56.

The description of FIGS. 1-3 indicates that the wordlines 14 are under the memory cells 12, and that the bitlines 56 are over the memory cells. In other applications, the relative orientation of the wordlines and bitlines may be reversed so that the bitlines are under the memory cells and the wordlines are over the memory cells. The terms "access/sense line," "wordline/bitline," "bitline/wordline" and "sense/access line" may be utilized herein to generically refer to bitlines and wordlines in contexts in which an indicated structure may be either a wordline or a bitline.

The conductive interconnects 50 of FIGS. 3 and 3A may be utilized to enable circuitry from one tier to be electrically coupled with circuitry of another tier within a multitier stack. For instance, FIG. 4 shows a multitier stack 58 having three tiers 60, 62 and 64 which are vertically offset relative to one another. The vertically-stacked arrangement of FIG. 4 may extend upwardly to include additional tiers. The tiers 60, 62 and 64 may be considered to be examples of levels that are stacked one atop the other. The levels may be within different semiconductor dies (wafers), or at least two of the levels may be within the same semiconductor die. The bottom tier 60 may include control circuitry and/or sensing circuitry (e.g., may include wordline drivers, sense amplifiers, etc.; and may include CMOS circuitry, as shown). The upper tiers 62 and 64 may include memory arrays, such as, for example, the memory array 11 of FIGS. 3 and 3A. The memory arrays within the various tiers may be the same as one another (e.g., may all be arrays of PCM devices), or may be different relative to one another (e.g., some may be arrays of PCM devices, while others are not). Also, one or more of the upper tiers may include control circuitry or other logic circuitry.

The conductive interconnects 50 are illustrated as enabling connection from circuitry of the tiers 62 and 64 to the circuitry of the tier 60, with such connections being diagrammatically shown utilizing dashed arrows 61. In an example embodiment, a sense/access line 56 within the tier 62 (which may be referred to as a memory tier) is coupled with circuitry of the tier 60 through the interconnect 50. For instance, a bitline associated with the memory array 11 within the tier 62 may be coupled with a sense amplifier within the tier 60, or a wordline associated with the memory array 11 within the tier 62 may be coupled with a wordline driver within the tier 60. The problems discussed relative to FIG. 3 may problematically interfere with the coupling from circuitry associated with one of the tiers 60, 62 and 64 to circuitry associated with another of such tiers.

Some embodiments include methods for alleviating the problematic nonplanar profile 53 of FIGS. 2 and 3.

Figure 5:
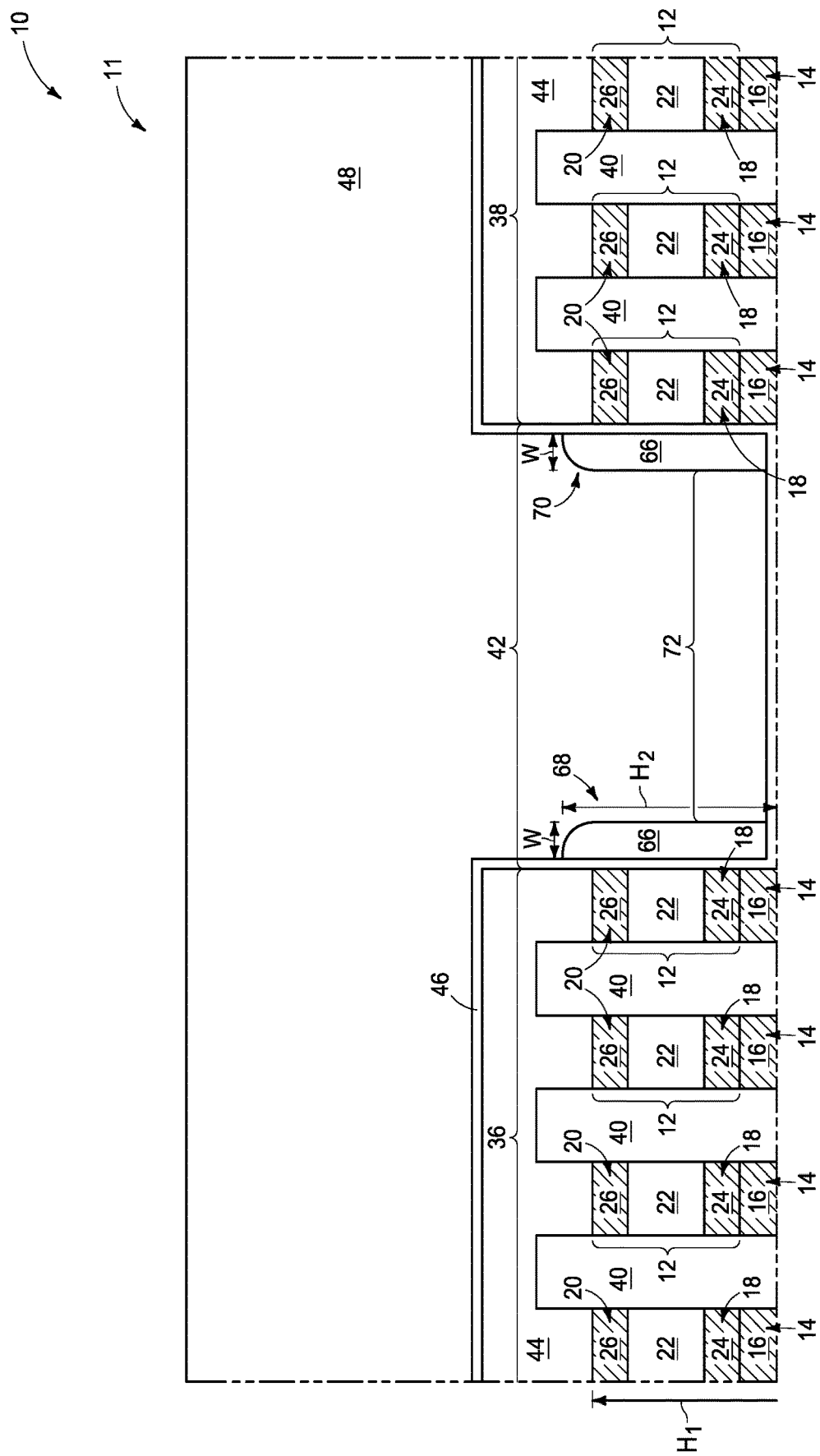
FIG. 5 is a diagrammatic cross-sectional side view of an assembly at an example process stage of an example embodiment.

Referring to FIG. 5, the assembly 10 is shown at a process stage analogous to that described above with reference to FIG. 1. However, the assembly includes support material 66 adjacent the first and second sets (36, 38) of memory cells 12. The support material 66 may comprise insulative material, and may be referred to as insulative support material. The support material 66 comprises a different composition than the intervening material 48; and in some embodiments may comprise one or more high-k materials. The term "high-k" means a dielectric constant greater than that of silicon dioxide (i.e., greater than 3.9). In some embodiments, the support material 66 may comprise, consist essentially of, or consist of one or more of silicon nitride, silicon oxynitride, aluminum oxide, hafnium oxide and zirconium oxide. It may be desirable for the material 66 to be suitable for deposition at relatively low temperatures (since it is being deposited after the memory cells 12 are formed), to have high etch selectivity relative to silicon dioxide, to be suitable for deposition with good conformality, and/or to have a slower polish rate than the material 48 (i.e., to be relatively resilient to a polishing process so that the material 48 is selectively removed by the polishing process as compared to the material 66).

The support material 66 is shown to be within two structures (mandrels) 68 and 70 along the cross-section of FIG. 5. In some embodiments, the structures 68 and 70 may be referred to as first and second pillars, respectively. The support material 66 may extend around a periphery of the coupling location 42 so that the illustrated structures 68 and 70 are part of a single continuous structure (diagrammatically shown in FIG. 6A). The material 66 may be formed in the shown configuration of FIG. 5 by depositing the material within the region 42 of assembly 10, and then subjecting the material 66 to a spacer etch (i.e., an anisotropic etch). The structures 68 and 70 have rounded upper edges resulting from the spacer etch. In other embodiments, the structures 68 and 70 may have other configurations.

The cross-sectional view of FIG. 5 shows the structures 68 and 70 spaced from one another by an intervening region 72 comprising the intervening insulative material 48.

The structures 68 and 70 (i.e., the support material 66) may be formed to any suitable width W, and in some embodiments have a width W within a range of from about 50 angstroms (Å) to about 1000 Å.

Figure 5A:
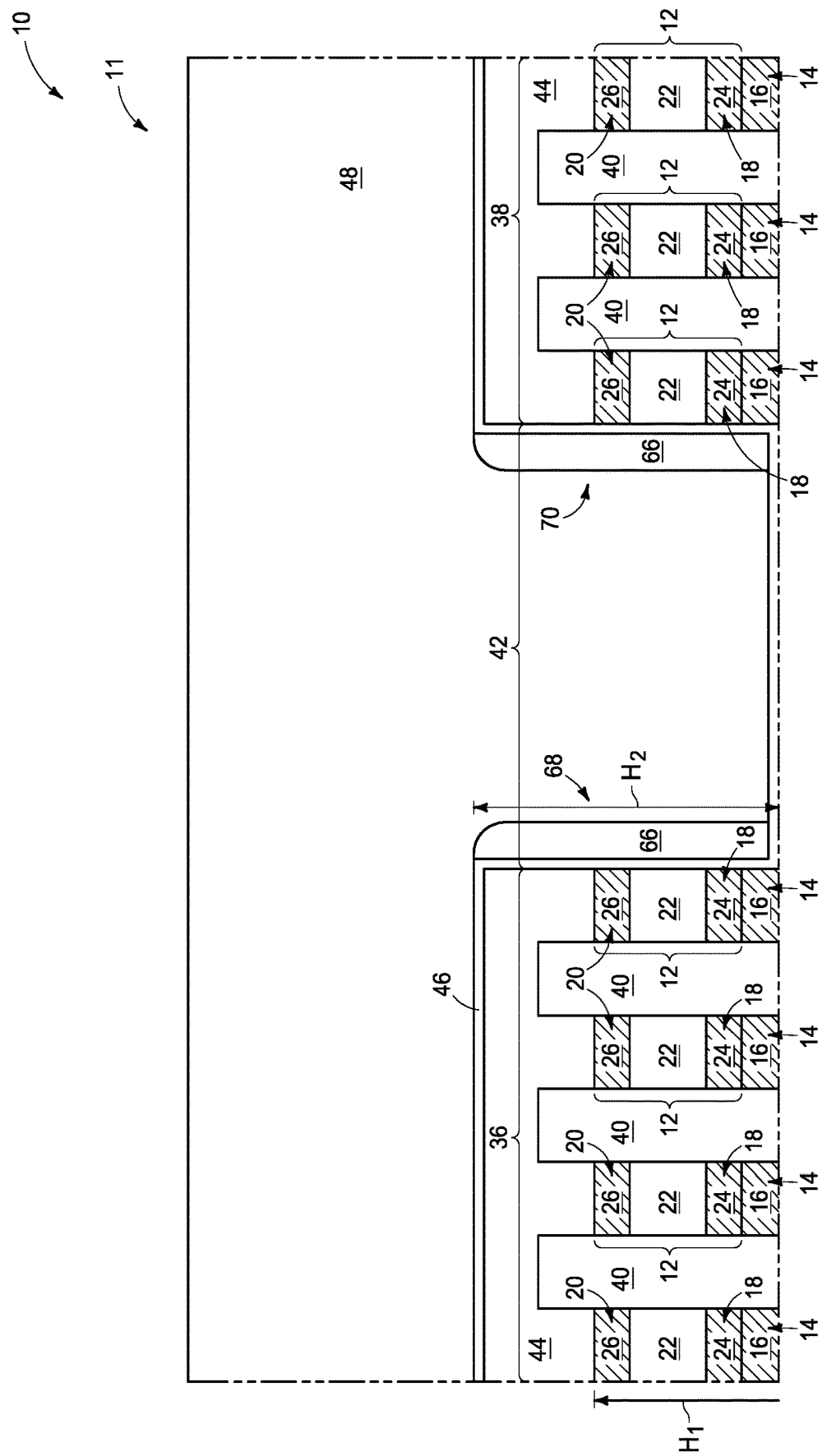
FIG. 5A is a diagrammatic cross-sectional side view of an example assembly which may be utilized alternatively to that of FIG. 5.

The support material 66 is preferably formed to a height at least about equal to the height of the memory cells 12, and in some embodiments is formed to a height greater than or equal to the height of the memory cells. FIG. 5 shows the memory cells 12 formed to a first height $H_1$, and shows the structures 68 and 70 formed to a second height $H_2$ which is a little above the first height. FIG. 5A shows an alternate embodiment in which the second height $H_2$ is much greater than the first height $H_1$. FIG. 5A also shows that the top of the support material is curved as would generally result from a spacer etch of the material 66.

Figure 6:
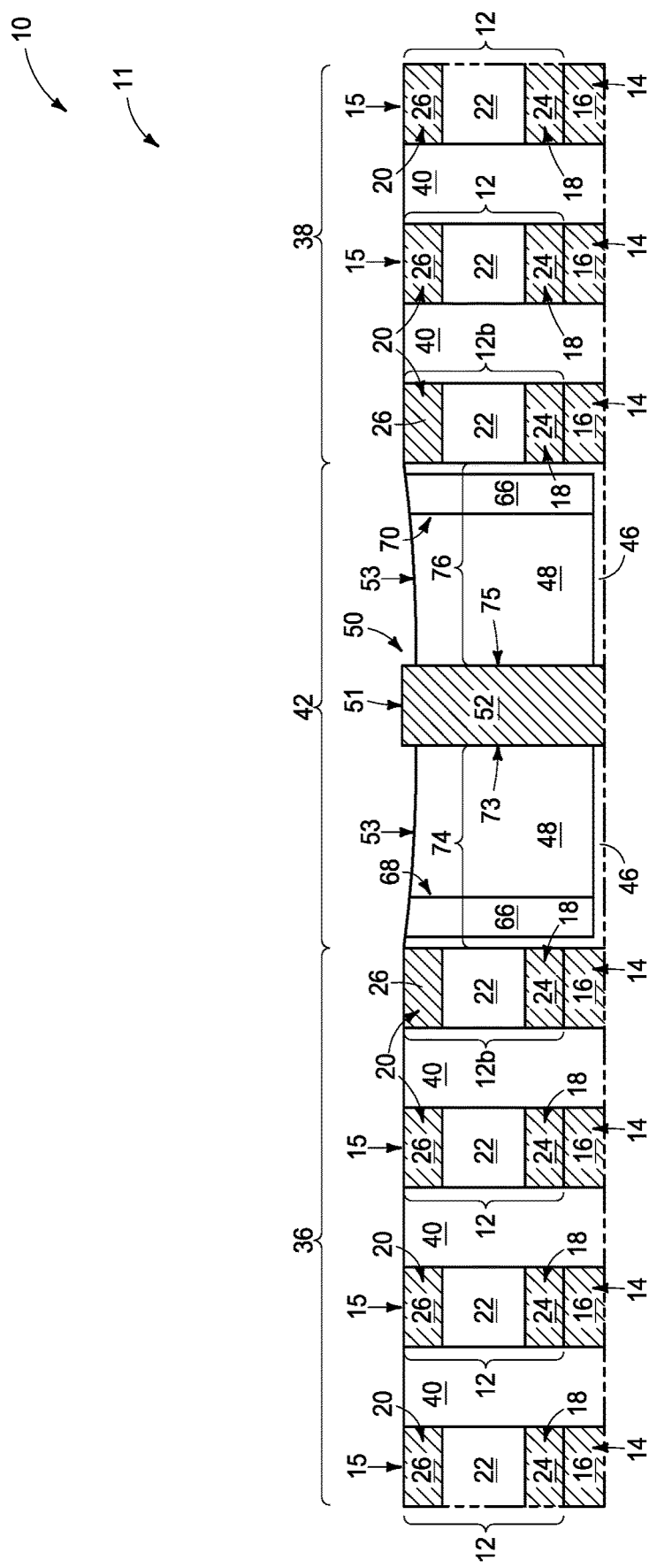
FIG. 6 is a diagrammatic cross-sectional side view of the assembly of FIG. 5 at an example process stage following that of FIG. 5.

Referring to FIG. 6, the assembly 10 is shown at a processing stage subsequent to that of FIG. 5, and analogous to that of FIG. 2. The conductive interconnect 50 is formed within the coupling region 42, and extends through the intervening insulative material 48. The conductive interconnect 50 has opposing sidewalls (i.e., sidewall surfaces) 73 and 75 along the cross-section of FIG. 6. The sidewalls 73 and 75 may be referred to as first and second sidewalls, respectively. The first sidewall 73 is spaced from the first set 36 of memory cells 12 by a first region 74 which includes the first pillar 68, and the second sidewall 75 is spaced from the second set 38 of memory cells 12 by a second region 76 which includes the second pillar 70. In some embodiments, the memory cell sets 36 and 38 may be referred to as tiles, and the pillars 68 and 70 may be considered to be adjacent to edges of such tiles.

The upper surface of the assembly 10 has been polished with one or more polishing steps analogous to those described above with reference to FIG. 2, and such have reduced an overall height of the assembly. In the illustrated embodiment, the pillars 68 and 70 are about the same height as the memory cells 12 at the processing stage of FIG. 6 (i.e., after one or more polishing processes).

The first and second pillars 68 and 70 (i.e., the support material 66) provide support during the polishing to protect the memory cells 12 from being eroded. Specifically, the nonplanar profile 53 is shown to be less severe at the processing stage of FIG. 6 relative to that of FIG. 2 (and in some embodiments may be absent, or at least substantially entirely absent). The nonplanar profile 53 of the configuration of FIG. 6 extends only to the support material 66, and not to the memory cells 12b (in contrast to the configuration described above with reference to FIG. 2). Thus, the memory cells 12b may remain fully functional after the polishing utilized to expose the upper surfaces 15 and 51 of the memory cells and the conductive interconnect 50 in applications in which the support material 66 protects such memory cells from erosion.

Figure 6A:
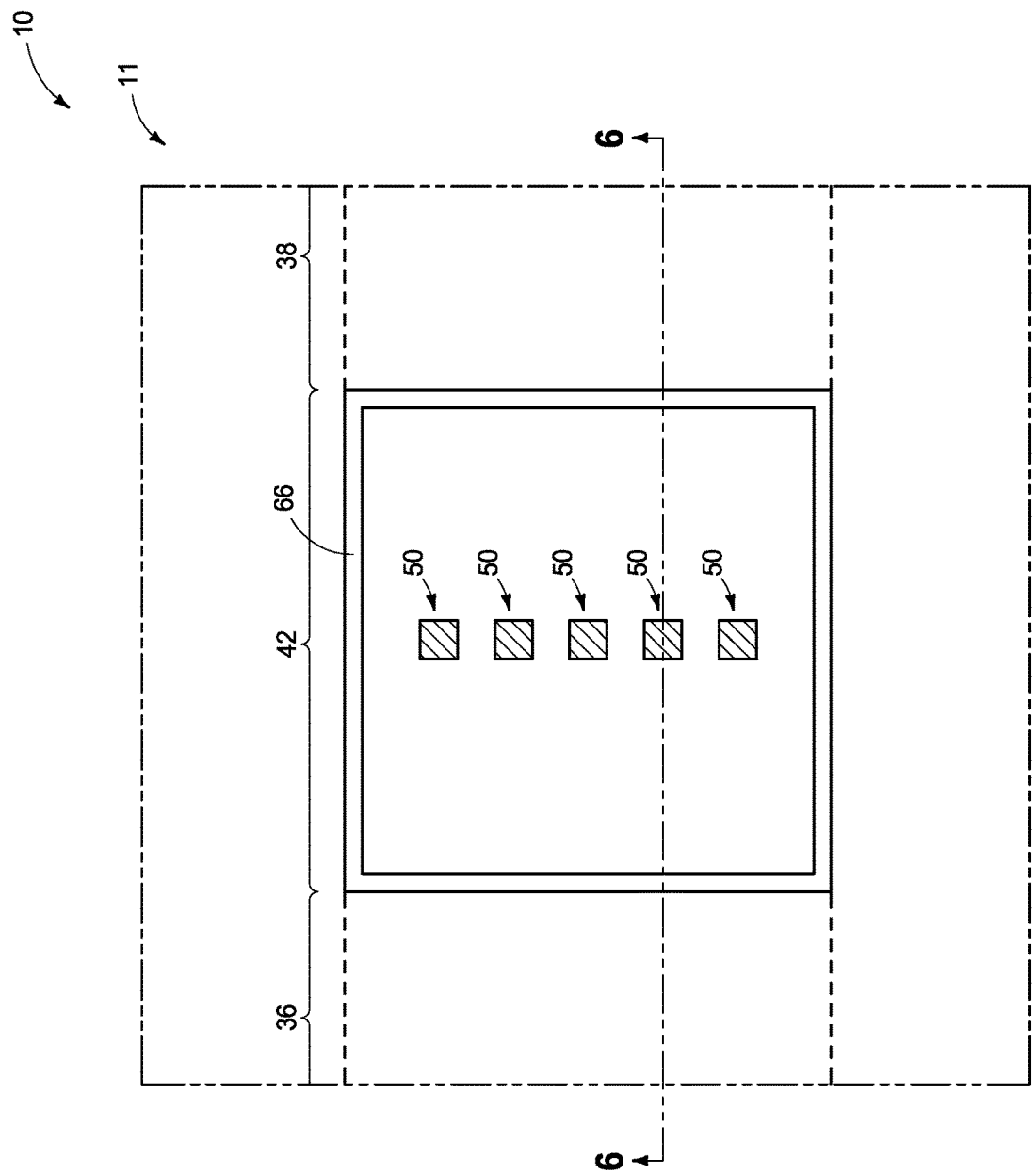
FIG. 6A is a diagrammatic top view of a region of the assembly of FIG. 6. The cross-section of FIG. 6 is along the line 6-6 of FIG. 6A.

FIG. 6A shows a top view of the assembly 10 at the processing stage of FIG. 6 utilizing a diagrammatic illustration analogous to that of FIG. 2A.

Figure 7:
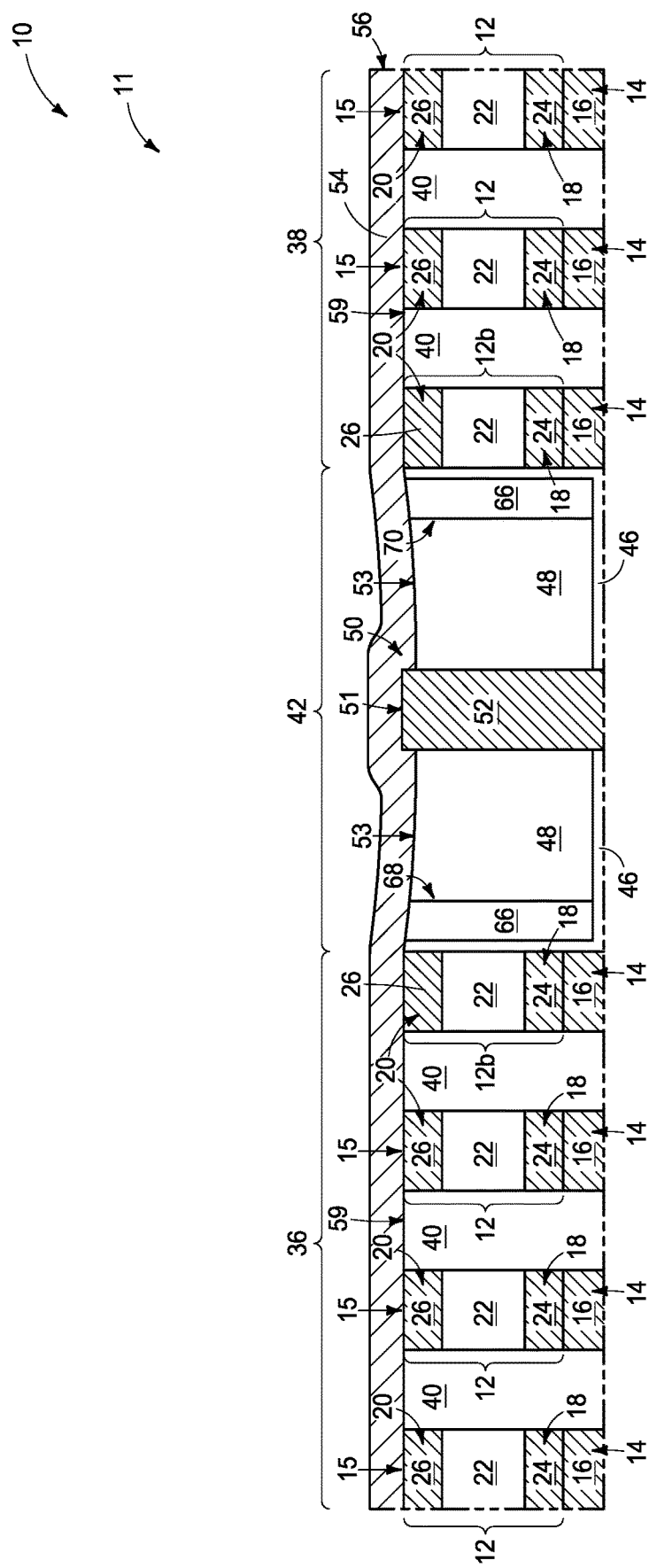
FIG. 7 is a diagrammatic cross-sectional side view of the assembly of FIG. 5 at an example process stage following that of FIG. 6.

Referring to FIG. 7, the assembly 10 is shown at a processing stage subsequent to that of FIG. 6, and analogous to that of FIG. 3. The conductive material 54 is formed over an upper surface of the assembly 10, and is patterned into the bitline 56. However, since the nonplanar profile 53 of FIG. 7 is much less pronounced than that of FIG. 3, the problems described above with reference to FIG. 3 may be alleviated or even entirely avoided. Thus, the utilization of the support material 66 may advantageously enable the bitline 56 to be fabricated with fewer difficulties than would be incurred in the absence of the support material.

Figure 7A:
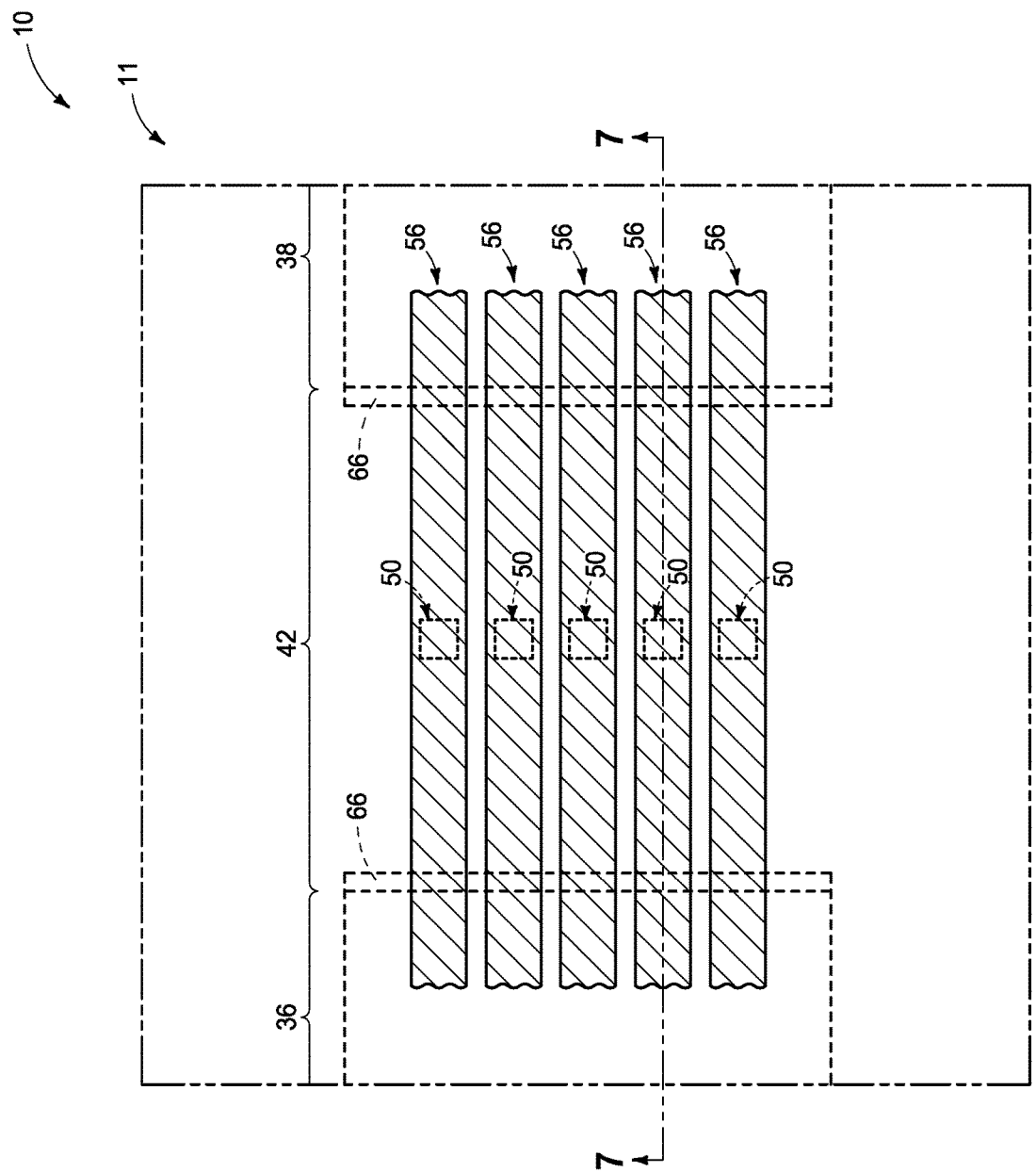
FIG. 7A is a diagrammatic top view of a region of the assembly of FIG. 7. The cross-section of FIG. 7 is along the line 7-7 of FIG. 7A.

FIG. 7A shows a top view of the assembly 10 at the processing stage of FIG. 7 utilizing a diagrammatic illustration analogous to that of FIG. 3A. The diagram of FIG. 7A shows that the conductive interconnect 50 of FIG. 7 is one of many substantially identical conductive interconnects, with others of the conductive interconnects being out of the plane of the cross-section of FIG. 7; and shows that the bitline 56 is one of many substantially identical bitlines, with others of the bitlines being out of the plane of the cross-section of FIG. 7. The support material 66 is diagrammatically illustrated in dashed-line view in FIG. 7A to remind the reader that the support material 66 is under the digit lines and supporting regions of the digit lines.

FIG. 7B shows another diagrammatic top view of the assembly 10 at the processing stage of FIG. 7. FIG. 7B shows the wordlines 14 arranged as a first series of sense/access lines under the memory cells 12, and shows the bitlines 56 arranged as a second series of sense/access lines over the memory cells 12 (with the lines 14 of the first series being substantially orthogonal to the lines 56 of the second series in the illustrated embodiment). The memory cells 12 are not visible in FIG. 7B, but are to be understood as being at cross-points where the access/sense lines 56 cross the access/sense lines 14 (diagrammatically illustrated with a dashed-line arrow at one of the cross-points). As can be understood with reference to FIG. 7, each of the access/sense lines 56 is electrically connected with memory cells 12 of the first and second sets 36 and 38, and is also coupled with a conductive interconnect 50.

Figure 8:
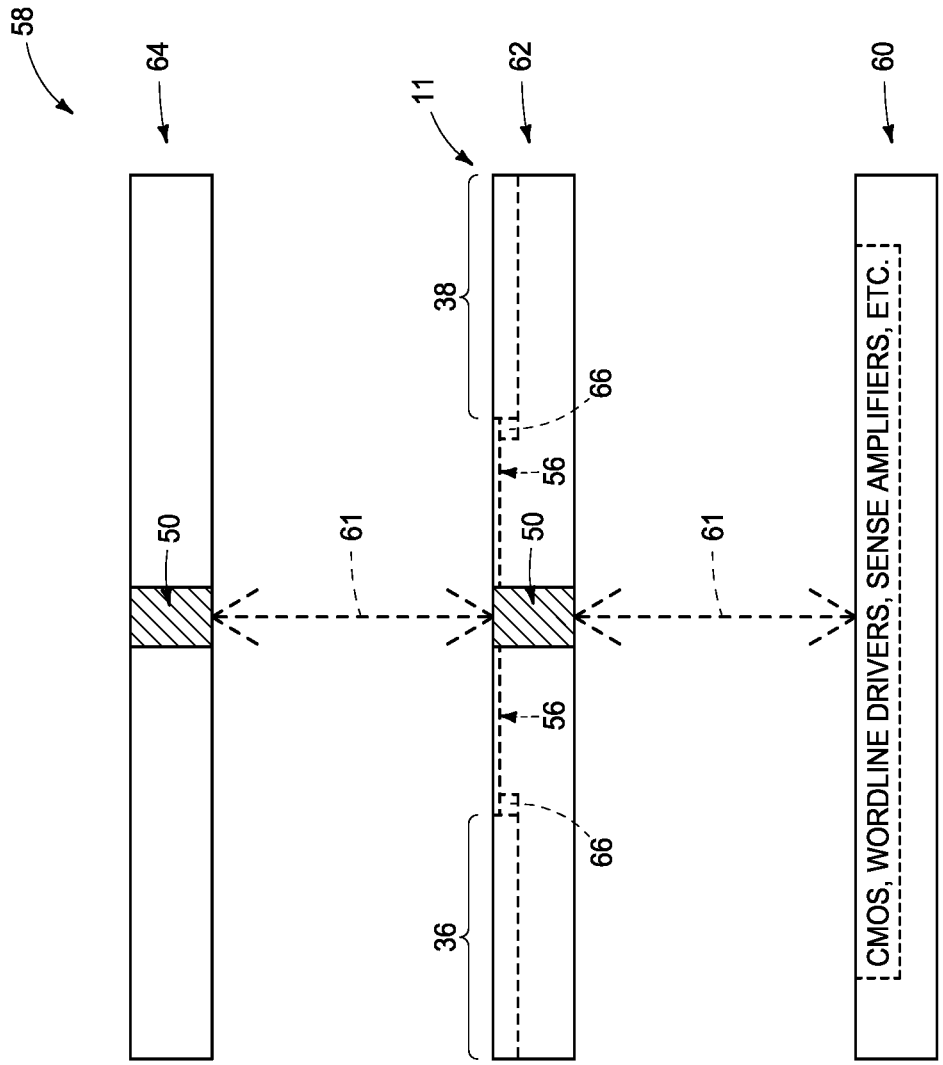
FIG. 8 is a diagrammatic cross-sectional side view of an example multitier configuration.

FIG. 8 shows a multitier assembly 58 analogous to that of FIG. 4, and comprising the memory array 11 of FIG. 7 along the second tier 62. The access/sense lines 56 are coupled to CMOS circuitry within the tier 60 through the conductive interconnect 50. In the illustrated embodiment, the CMOS circuitry is below the tier 62 comprising the memory array 11. In other embodiments, the tier 60 comprising the CMOS circuitry may be in other locations relative to the tier 62.

The support material 66 is diagrammatically illustrated in FIG. 8 as being under the illustrated access/sense line 56 and supporting regions of the access/sense line 56 adjacent the regions 36 and 38 of the memory array 11.

The additional tier 64 may be omitted in some embodiments. Alternatively, the tier 64 may comprise another memory array. The memory array of the tier 64 may be an array of PCM devices analogous to the array shown in FIG. 7, or may be a different type of array. In yet other embodiments, the tier 64 may comprise other circuitry besides an array, such as, for example, sensor circuitry.

Figure 9:
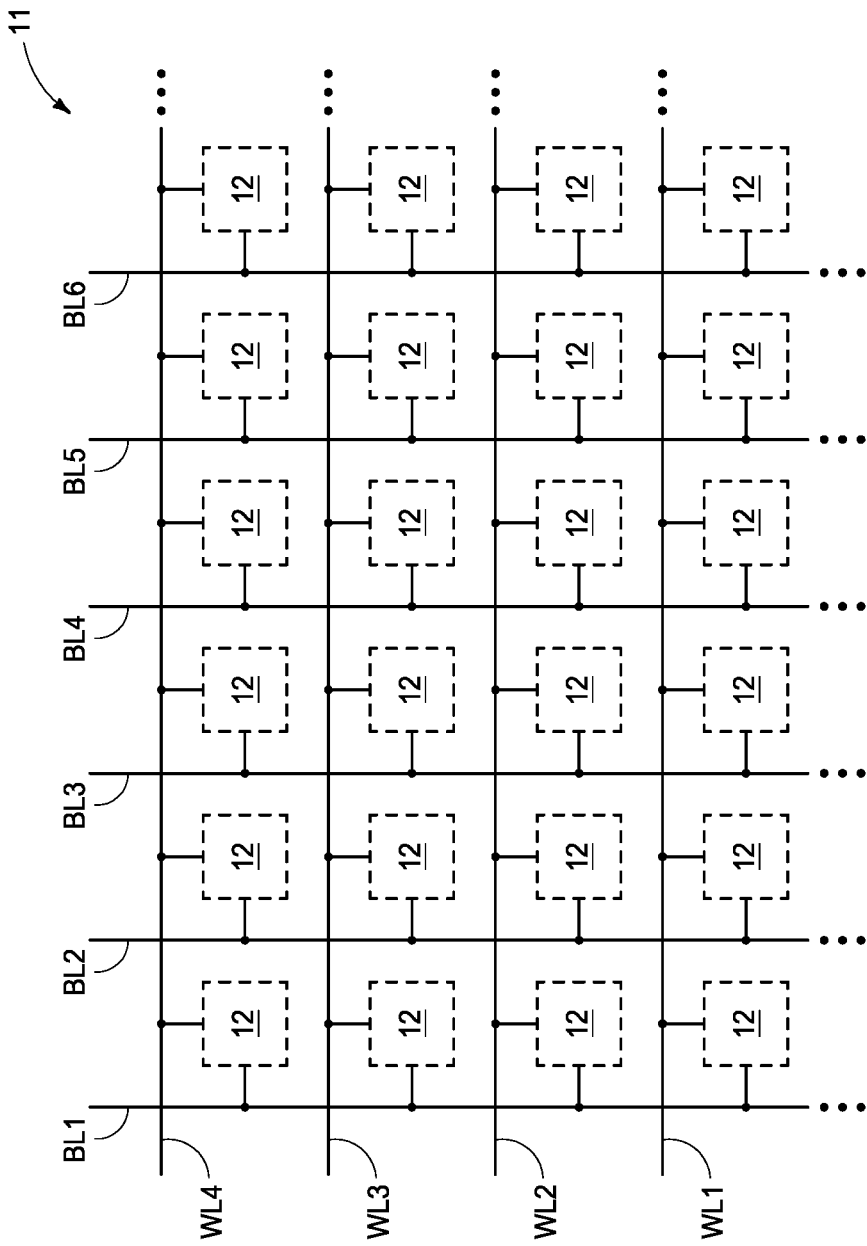
FIG. 9 is a diagrammatic schematic view of an example memory array.

The memory arrays 11 of the above-discussed embodiments may have any suitable configurations. FIG. 9 schematically illustrates an example configuration of an example memory array 11. Such configuration includes the memory cells 12 at cross-points where wordlines (WL1-WL4) pass bitlines (BL1-BL6). Each of the memory cells is uniquely addressed through a combination of one of the wordlines and one of the bitlines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an arrangement. An assembly is formed which comprises, along a cross-section, a first set of memory cells on one side of a coupling region, and a second set of memory cells on an opposing side of the coupling region. The assembly includes, along the cross-section, a first pillar adjacent the first set of memory cells and a second pillar adjacent the second set of memory cells. The first and second pillars comprise a first composition, and are spaced from one another by intervening insulative material having a second composition which is different than the first composition. The memory cells have a first height within the assembly. The first and second pillars have a second height within the assembly which is greater than or equal to the first height. A conductive interconnect is formed within the coupling region and extends through the intervening insulative material. The conductive interconnect has first and second sidewalls along the cross-section, with the first sidewall being in opposing relation to the second sidewall. The first sidewall of the interconnect is spaced from the first set of the memory cells by a first region which includes the first pillar, and the second sidewall of the interconnect is spaced from the second set of memory cells by a second region which includes the second pillar. An upper surface of the assembly is polished with one or more polishing steps to reduce an overall height of the assembly. The first and second pillars provide support during the polishing to protect the memory cells of the first and second sets from being eroded during the polishing.

Some embodiments include a method of forming an arrangement. A first tier is formed to include CMOS circuitry. A second tier is formed to include an assembly which has a first set of memory cells on one side of a coupling region, and which has a second set of memory cells on an opposing side of the coupling region. The assembly includes an insulative support material adjacent the first and second sets of the memory cells, and includes an intervening insulative material adjacent the insulative support material. The insulative support material has a first composition and the intervening insulative material has a second composition which is different than the first composition. A conductive interconnect is formed within the coupling region and extends through the intervening insulative material. An upper surface of the assembly is polished with one or more polishing steps to reduce an overall height of the assembly. The insulative support material provides support during the polishing to protect the memory cells of the first and second sets from being eroded during the polishing. The conductive interconnect of the second tier is coupled with the CMOS circuitry of the first tier.

Some embodiments include an arrangement comprising a memory tier which includes an assembly comprising a first set of memory cells on one side of a coupling region, and a second set of memory cells on an opposing side of the coupling region. The assembly includes an insulative support material adjacent the first and second sets of memory cells, and an intervening insulative material adjacent the insulative support material. The insulative support material comprises a first composition and the intervening insulative material comprises a second composition which is different than the first composition. The insulative support material has about a same height as the memory cells of the first and second sets. A conductive interconnect is within the coupling region of the memory tier and extends through the intervening insulative material. An additional tier is under the memory tier. The additional tier comprises CMOS circuitry which is coupled with the conductive interconnect.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an arrangement, comprising:
    forming an assembly comprising, along a cross-section, a first set of memory cells on one side of a coupling region, and a second set of memory cells on an opposing side of the coupling region;
    forming a first pillar comprising a first composition and a second pillar comprising the first composition, the first pillar being adjacent the first set of memory cells and the second pillar being adjacent the second set of memory cells; the first composition being entirely within the coupling region, the first and second pillars being spaced from one another by intervening insulative material having a second composition which is different than the first composition; the memory cells having a first height within the assembly; the first and second pillars having a second height within the assembly which is greater than or equal to the first height;
    forming a conductive interconnect within the coupling region and extending through the intervening insulative material; the conductive interconnect having first and second sidewalls along the cross-section, with the first sidewall being in opposing relation to the second sidewall; the first sidewall of the conductive interconnect being spaced from the first set of the memory cells by a first region which includes the first pillar, and the second sidewall of the conductive interconnect being spaced from the second set of memory cells by a second region which includes the second pillar; and
    polishing an upper surface of the assembly with one or more polishing steps to reduce an overall height of the assembly; the first and second pillars providing support during the polishing to protect the memory cells of the first and second sets from being eroded during the polishing.

2. The method of claim 1 wherein the first composition includes one or more of silicon nitride, silicon oxynitride, aluminum oxide, hafnium oxide and zirconium oxide.

3. The method of claim 1 wherein the second composition comprises silicon dioxide, and wherein the first composition comprises one or more high-k materials.

4. The method of claim 1 wherein the first and second pillars have widths along the cross-section within a range of from about 50 Å to about 1000 Å.

5. A method of forming an arrangement, comprising:
    forming an assembly comprising, along a cross-section, a first set of memory cells on one side of a coupling region, and a second set of memory cells on an opposing side of the coupling region, the memory cells of the first and second sets being formed over a first series of access/sense lines; the assembly including, along the cross-section, a first pillar adjacent the first set of memory cells and a second pillar adjacent the second set of memory cells; the first and second pillars comprising a first composition, and being spaced from one another by intervening insulative material having a second composition which is different than the first composition; the memory cells having a first height within the assembly; the first and second pillars having a second height within the assembly which is greater than or equal to the first height;
    forming a conductive interconnect within the coupling region and extending through the intervening insulative material; the conductive interconnect having first and second sidewalls along the cross-section, with the first sidewall being in opposing relation to the second sidewall; the first sidewall of the conductive interconnect being spaced from the first set of the memory cells by a first region which includes the first pillar, and the second sidewall of the conductive interconnect being spaced from the second set of memory cells by a second region which includes the second pillar;
    polishing an upper surface of the assembly with one or more polishing steps to reduce an overall height of the assembly; the first and second pillars providing support during the polishing to protect the memory cells of the first and second sets from being eroded during the polishing; and
    forming an access/sense line of a second series to extend across the memory cells of the first and second sets, and across the conductive interconnect; the access/sense line of the second series being electrically connected with the memory cells of the first and second sets along the cross-section, and being electrically connected with the conductive interconnect.

6. The method of claim 5 wherein:
    the cross-section is along a plane; and
    the conductive interconnect is one of many substantially identical conductive interconnects, with others of the conductive interconnects being formed out of the plane of the cross-section.

7. The method of claim 6 wherein the access/sense line of the second series is one of many access/sense lines of the second series, with others of the access/sense lines of the second series being formed out of the plane of the cross-section.

8. The method of claim 7 wherein the access/sense lines of the first series are wordlines, and wherein the access/sense lines of the second series are bitlines.

9. The method of claim 1 wherein the memory cells of the first and second sets are self-selecting memory cells comprising chalcogenide.

10. The method of claim 9 wherein the memory cells of the first and second sets include upper and lower electrodes, and wherein the chalcogenide is between the upper electrodes and the lower electrodes.

11. The method of claim 1 wherein each of the memory cells of the first and second sets includes a programmable material and a select device.

12. The method of claim 11 wherein the memory cells of the first and second sets include upper electrodes, lower electrodes and middle electrodes between the upper and lower electrodes; a first ovonic material being between the upper electrodes and the middle electrodes, and a second ovonic material being between the middle electrodes and the lower electrodes; one of the first and second ovonic materials being the programmable material of the memory cells, and the other of the first and second ovonic materials being incorporated into ovonic threshold switches of the select devices.

13. The method of claim 1 wherein the memory cells of first and second sets are within one tier of a multitier configuration; and wherein the conductive interconnect is coupled with circuitry in another tier of the multitier configuration, with said other tier being vertically offset from said one tier.

14. The method of claim 13 wherein said other tier is below said one tier, and wherein the circuitry in said other tier includes CMOS circuitry.

15. A method of forming an arrangement, comprising:
forming a first tier to comprise CMOS circuitry;
forming a second tier to include an assembly comprising a first set of memory cells on one side of a coupling region, and a second set of memory cells on an opposing side of the coupling region each of the memory cells of the first and second sets including a programmable material and a select device; the assembly including an insulative support material adjacent the first and second sets of the memory cells, and including an intervening insulative material adjacent the insulative support material; the insulative support material comprising a first composition formed as pillars and being entirely within the coupling region and the intervening insulative material comprising a second composition which is different than the first composition;
forming a conductive interconnect within the coupling region and extending through the intervening insulative material;
polishing an upper surface of the assembly with one or more polishing steps to reduce an overall height of the assembly; the insulative support material providing support during the polishing to protect the memory cells of the first and second sets from being eroded during the polishing; and
coupling the conductive interconnect of the second tier with the CMOS circuitry of the first tier.

16. The method of claim 15 wherein the first tier is below the second tier.

17. The method of claim 15 wherein the second composition comprises silicon dioxide, and wherein the first composition comprises one or more high-k materials.

18. A method of forming an arrangement, comprising:
forming a first tier to comprise CMOS circuitry;
forming a second tier to include an assembly comprising a first set of memory cells on one side of a coupling region, and a second set of memory cells on an opposing side of the coupling region the memory cells of the first and second sets being over a first series of access/sense lines; the assembly including an insulative support material adjacent the first and second sets of the memory cells, and including an intervening insulative material adjacent the insulative support material; the insulative support material comprising a first composition and the intervening insulative material comprising a second composition which is different than the first composition;
forming a conductive interconnect within the coupling region and extending through the intervening insulative material;
polishing an upper surface of the assembly with one or more polishing steps to reduce an overall height of the assembly; the insulative support material providing support during the polishing to protect the memory cells of the first and second sets from being eroded during the polishing;
coupling the conductive interconnect of the second tier with the CMOS circuitry of the first tier; and
forming an access/sense line of a second series to extend across the memory cells of the first and second sets, and across the conductive interconnect; the access/sense line of the second series being electrically connected with the memory cells of the first and second sets, and being electrically connected with the conductive interconnect.

19. The method of claim 18 wherein the conductive interconnect is one of many substantially identical conductive interconnects, and wherein the access/sense line of the second series is one of many access/sense lines of the second series.

20. The method of claim 18 wherein the access/sense lines of the first series are wordlines, and wherein the access/sense lines of the second series are bitlines.

21. The method of claim 18 wherein the memory cells of the first and second sets are self-selecting memory cells comprising chalcogenide.

* * * * *